United States Patent
Masuda (10) Patent No.: US 9,659,773 B2
(45) Date of Patent: May 23, 2017

(54) METHOD FOR MANUFACTURING SILICON CARBIDE SEMICONDUCTOR DEVICE BY SELECTIVELY REMOVING SILICON FROM SILICON CARBIDE SUBSTRATE TO FORM PROTECTIVE CARBON LAYER ON SILICON CARBIDE SUBSTRATE FOR ACTIVATING DOPANTS

(71) Applicant: Sumitomo Electric Industries, Ltd., Osaka (JP)

(72) Inventor: Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/024,171

(22) PCT Filed: Aug. 11, 2014

(86) PCT No.: PCT/JP2014/071165
§ 371 (c)(1),
(2) Date: Mar. 23, 2016

(87) PCT Pub. No.: WO2015/045653
PCT Pub. Date: Apr. 2, 2015

(65) Prior Publication Data
US 2016/0240655 A1    Aug. 18, 2016

(30) Foreign Application Priority Data

Sep. 25, 2013   (JP) ................................. 2013-198214

(51) Int. Cl.
H01L 21/04       (2006.01)
H01L 29/78       (2006.01)
(Continued)

(52) U.S. Cl.
CPC ...... *H01L 21/0445* (2013.01); *H01L 21/0405* (2013.01); *H01L 21/045* (2013.01);
(Continued)

(58) Field of Classification Search
CPC ............. H01L 21/0465; H01L 21/0475; H01L 21/046; H01L 21/045; H01L 21/049; H01L 21/0455; H01L 21/0405; H01L 21/0445
See application file for complete search history.

(56) References Cited

U.S. PATENT DOCUMENTS 6,429,518 B1 *   8/2002   Endo ................... H01L 21/3127
                                                     257/753
2006/0220027 A1  10/2006  Takahashi et al.
(Continued)

FOREIGN PATENT DOCUMENTS

JP    2001-068428       3/2001
JP    2009-212325 A     9/2009
(Continued)

OTHER PUBLICATIONS

International Search Report in PCT International Application No. PCT/JP2014/071165, dated Nov. 11, 2014.

*Primary Examiner* — Michael Jung
(74) *Attorney, Agent, or Firm* — Venable LLP; Michael A. Sartori; F. Brock Riggs (57) ABSTRACT

A method for manufacturing a SiC semiconductor device includes the steps of: forming an impurity region in a SiC layer; forming a first carbon layer on a surface of the SiC layer having the impurity region formed therein, by selectively removing silicon from the surface; forming a second carbon layer on the first carbon layer; and heating the SiC layer having the first carbon layer and the second carbon layer formed therein.

13 Claims, 9 Drawing Sheets

(51) Int. Cl.
*H01L 21/324* (2006.01)
*H01L 29/16* (2006.01)
*H01L 29/66* (2006.01)
*H01L 29/06* (2006.01)
*H01L 21/3065* (2006.01)
*H01L 29/04* (2006.01)
*H01L 29/10* (2006.01)

(52) U.S. Cl.
CPC .......... H01L 21/046 (2013.01); H01L 21/049 (2013.01); H01L 21/0455 (2013.01); H01L 21/0465 (2013.01); H01L 21/0475 (2013.01); H01L 21/3065 (2013.01); H01L 21/324 (2013.01); H01L 29/045 (2013.01); H01L 29/0615 (2013.01); H01L 29/0619 (2013.01); H01L 29/0661 (2013.01); H01L 29/1095 (2013.01); H01L 29/1608 (2013.01); H01L 29/66068 (2013.01); H01L 29/7811 (2013.01); H01L 29/7813 (2013.01)

(56) References Cited

U.S. PATENT DOCUMENTS

| | | | |
|---|---|---|---|
| 2011/0223694 A1* | 9/2011 | Uda | C23C 16/325 438/14 |
| 2012/0028453 A1* | 2/2012 | Matsuno | H01L 21/046 438/522 |
| 2012/0231618 A1* | 9/2012 | Masuda | H01L 29/66068 438/522 |
| 2013/0023113 A1 | 1/2013 | Masuda et al. | |
| 2013/0065382 A1 | 3/2013 | Nishio et al. | |
| 2013/0075759 A1* | 3/2013 | Wada | H01L 21/0475 257/77 |
| 2014/0264579 A1* | 9/2014 | Pala | H01L 29/7802 257/339 |
| 2015/0044840 A1* | 2/2015 | Kobayashi | H01L 21/0223 438/285 |
| 2015/0072448 A1* | 3/2015 | Kobayashi | H01L 21/26513 438/17 |
| 2016/0111499 A1* | 4/2016 | Hisamoto | H01L 21/045 257/77 |
| 2016/0240380 A1* | 8/2016 | Horii | H01L 21/046 |

FOREIGN PATENT DOCUMENTS

| | | |
|---|---|---|
| JP | 2013-026372 A | 2/2013 |
| JP | 2013-058616 A | 3/2013 |
| WO | WO-2005/076327 A1 | 8/2005 |
| WO | WO-2013/011740 A1 | 1/2013 |

* cited by examiner

METHOD FOR MANUFACTURING SILICON CARBIDE SEMICONDUCTOR DEVICE BY SELECTIVELY REMOVING SILICON FROM SILICON CARBIDE SUBSTRATE TO FORM PROTECTIVE CARBON LAYER ON SILICON CARBIDE SUBSTRATE FOR ACTIVATING DOPANTS

TECHNICAL FIELD

The present invention relates to a method for manufacturing a silicon carbide semiconductor device, and more particularly to a method for manufacturing a silicon carbide semiconductor device capable of suppressing a reduction in manufacturing efficiency and performing activation annealing with a surface of a silicon carbide layer being protected more reliably.

BACKGROUND ART

In recent years, in order to achieve high breakdown voltage and low loss of semiconductor devices, use thereof in a high temperature environment, and the like, silicon carbide has begun to be adopted as a material for semiconductor devices. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device adopting silicon carbide as its material also has an advantage that its characteristics are less likely to be deteriorated when it is used in the high temperature environment, when compared with a semiconductor device adopting silicon as its material.

In the process for manufacturing a semiconductor device using silicon carbide as its material, impurities are introduced into a silicon carbide layer by ion implantation or the like, and thereafter activation annealing is performed. Thereby, desired carriers are generated in an impurity region within the silicon carbide layer. Since this activation annealing is performed at a high temperature exceeding 1500° C. for example, it is necessary to suppress surface roughness in the silicon carbide layer caused by heating. In response, processes for performing activation annealing with a carbon layer deposited on a surface of a silicon carbide layer have been proposed (see, for example, Japanese Patent Laying-Open No. 2001-68428 (PTD 1) and Japanese Patent Laying-Open No. 2013-26372 (PTD 2)).

PTD 1 discloses a process for performing activation annealing with a diamond like carbon (DLC) film or a film obtained by carbonizing a photoresist film being deposited on a surface of an epitaxial growth layer (a silicon carbide layer). Further, PTD 2 discloses a process for selectively removing silicon from a surface layer portion of a silicon carbide layer to form a carbon layer, and thereafter performing activation annealing.

CITATION LIST

Patent Document

PTD 1: Japanese Patent Laying-Open No. 2001-68428
PTD 2: Japanese Patent Laying-Open No. 2013-26372

SUMMARY OF INVENTION

Technical Problem

In the process disclosed in PTD 1 described above, a carbon layer is formed on the surface of the silicon carbide layer by a method such as a CVD (Chemical Vapor Deposition) method or a sputtering method. However, the CVD method has a problem that film coverage worsens when the surface of the silicon carbide layer has a large step difference or projection/depression, and the sputtering method has a problem that film adhesiveness is low and cracks are likely to occur. In addition, when the film obtained by carbonizing the photoresist film is formed, in-plane film thickness has large variations (i.e., film thickness distribution worsens). Therefore, in these methods, it is difficult to perform activation annealing with the surface of the silicon carbide layer being fully protected.

Further, in the process disclosed in PTD 2 described above, the carbon layer is formed by transforming the surface layer portion of the silicon carbide layer. Thus, in this process, a portion of an impurity region formed in the surface layer portion of the silicon carbide layer is consumed by the formation of the carbon layer. Therefore, in this process, it is necessary to form the impurity region more deeply, taking the consumption by the formation of the carbon layer into consideration. As a result, manufacturing efficiency is reduced.

The present invention has been made in view of the aforementioned problems, and one object of the present invention is to provide a method for manufacturing a silicon carbide semiconductor device capable of suppressing a reduction in manufacturing efficiency and performing activation annealing with a surface of a silicon carbide layer being protected more reliably.

Solution to Problem

A method for manufacturing a silicon carbide semiconductor device in accordance with the present invention includes the steps of: forming an impurity region in a silicon carbide layer; forming a first carbon layer on a surface of the silicon carbide layer having the impurity region formed therein, by selectively removing silicon from the surface; forming a second carbon layer on the first carbon layer; and heating the silicon carbide layer having the first carbon layer and the second carbon layer formed therein.

Advantageous Effects of Invention

According to the method for manufacturing a silicon carbide semiconductor device in accordance with the present invention, a reduction in manufacturing efficiency can be suppressed, and activation annealing can be performed with a surface of a silicon carbide layer being protected more reliably.

DESCRIPTION OF EMBODIMENTS

Description of Embodiment of the Invention of the Present Application

First, the contents of an embodiment of the present invention will be described in list form.

(1) A method for manufacturing a silicon carbide semiconductor device in accordance with the present embodiment includes the steps of: forming an impurity region (13, 14, 15) in a silicon carbide layer (10); forming a first carbon layer (20) on a surface (10A, SW, BW) of the silicon carbide layer having the impurity region formed therein, by selectively removing silicon from the surface; forming a second carbon layer (21) on the first carbon layer; and heating the silicon carbide layer having the first carbon layer and the second carbon layer formed therein.

In the method for manufacturing the silicon carbide semiconductor device in accordance with the present embodiment, first, the first carbon layer is formed on the surface of the silicon carbide layer by selectively removing silicon from the surface. Thereby, the surface of the silicon carbide layer can be reliably protected by the first carbon layer. Next, the second carbon layer is formed on the first carbon layer, and thereafter the silicon carbide layer is heated (activation annealing). Thereby, the thickness of the carbon layers required as the total thickness of the first carbon layer and the second carbon layer can be ensured even when the thickness of the first carbon layer is reduced to suppress consumption of the impurity region by the carbon layer. Accordingly, this can suppress a reduction in manufacturing efficiency due to formation of a thick first carbon layer and the resulting increased consumption of the impurity region. Therefore, according to the method for manufacturing the silicon carbide semiconductor device in accordance with the present embodiment, a reduction in manufacturing efficiency can be suppressed, and activation annealing can be performed with the surface of the silicon carbide layer being protected more reliably.

Here, "a state where silicon is selectively removed from the surface of the silicon carbide layer" refers to a state where more silicon atoms are separated when compared with carbon atoms constituting silicon carbide, and includes a state where silicon atoms are separated from the surface of the silicon carbide layer at a rate of more than 10 times that of carbon atoms, for example.

(2) In the method for manufacturing the silicon carbide semiconductor device, in the step of forming the first carbon layer, the first carbon layer may be formed to have a density higher than that of the second carbon layer.

Thereby, activation annealing can be performed with the surface of the silicon carbide layer being protected further reliably. As a result, surface roughness in the silicon carbide layer due to activation annealing can be suppressed.

(3) In the method for manufacturing the silicon carbide semiconductor device, in the step of forming the second carbon layer, the second carbon layer constituted of a single layer may be formed.

Thereby, a process can be further simplified, when compared with a case where the second carbon layer constituted of a plurality of layers is formed. As a result, manufacturing efficiency can be further improved.

(4) In the method for manufacturing the silicon carbide semiconductor device, in the step of forming the second carbon layer, the second carbon layer constituted of a plurality of layers may be formed.

Thereby, a denser second carbon layer can be formed, when compared with a case where the second carbon layer constituted of a single layer is formed. As a result, activation annealing can be performed with the surface of the silicon carbide layer being protected further reliably.

(5) In the method for manufacturing the silicon carbide semiconductor device, a plurality of laminated carbon layers (22, 23, 24) constituting the plurality of layers may be formed such that the laminated carbon layer close to the surface of the silicon carbide layer has a relatively high density.

Thereby, activation annealing can be performed with the surface of the silicon carbide layer being protected further reliably. As a result, surface roughness in the silicon carbide layer due to activation annealing can be suppressed more effectively.

(6) In the method for manufacturing the silicon carbide semiconductor device, the second carbon layer may be formed by at least one method selected from the group consisting of a method of carbonizing a resist film, a CVD method, and a sputtering method.

Thus, the second carbon layer can be formed using various methods different from the method for forming the first carbon layer.

(7) In the method for manufacturing the silicon carbide semiconductor device, in the step of forming the second carbon layer, the second carbon layer may be formed by heating the resist film at a temperature of more than or equal to 800° C. and less than or equal to 1000° C. and carbonizing the resist film.

When the heating temperature is less than 800° C., it is difficult to fully carbonize the resist film. On the other hand, as long as the heating temperature is more than or equal to 800° C., the resist film can be fully carbonized even when the heating temperature is less than or equal to 1000° C. Accordingly, the temperature for heating the resist film is preferably more than or equal to 800° C. and less than or equal to 1000° C.

(8) In the method for manufacturing the silicon carbide semiconductor device, in the step of heating the silicon carbide layer, the silicon carbide layer may be heated successively after carbonization of the resist film is completed in the step of forming the second carbon layer.

Thereby, manufacturing efficiency can be further improved, when compared with a case where the silicon carbide layer is once cooled down after carbonization of the resist film is completed.

(9) In the method for manufacturing the silicon carbide semiconductor device, in the step of heating the silicon carbide layer, the silicon carbide layer may be heated at a temperature of more than or equal to 1600° C. and less than or equal to 1900° C.

When the heating temperature is less than 1600° C., it is difficult to fully generate carriers in the impurity region within the silicon carbide layer. On the other hand, when the heating temperature exceeds 1900° C., the silicon carbide layer may be damaged by heating. Accordingly, the temperature for heating the silicon carbide layer is preferably more than or equal to 1600° C. and less than or equal to 1900° C.

(10) In the method for manufacturing the silicon carbide semiconductor device, in the step of forming the first carbon layer, the first carbon layer having a thickness of more than or equal to 10 nm and less than or equal to 50 nm may be formed.

When the thickness is less than 10 nm, it becomes difficult to perform activation annealing with the surface of the silicon carbide layer being protected reliably. On the other hand, when the thickness exceeds 50 nm, consumption of the impurity region by the formation of the first carbon layer is increased, and manufacturing efficiency is reduced. Accordingly, the first carbon layer is preferably formed to have a thickness of more than or equal to 10 nm and less than or equal to 50 nm.

(11) In the method for manufacturing the silicon carbide semiconductor device, in the step of forming the second carbon layer, the second carbon layer having a thickness of more than or equal to 50 nm may be formed.

When the thickness is less than 50 nm, it becomes difficult to fully cover the first carbon layer, and it becomes difficult to fully ensure the durability of the first carbon layer. Accordingly, the second carbon layer is preferably formed to have a thickness of more than or equal to 50 nm.

(12) In the method for manufacturing the silicon carbide semiconductor device, in the steps of forming the first carbon layer and forming the second carbon layer, the first carbon layer and the second carbon layer may be formed such that a total thickness of the first carbon layer and the second carbon layer is less than or equal to 1 μm.

When the total thickness exceeds 1 μm, it takes a long time to form the carbon layers, and the carbon layers can fully protect the surface of the silicon carbide layer even when the total thickness is less than or equal to 1 μm. Accordingly, the first carbon layer and the second carbon layer are preferably formed to have a total thickness of less than or equal to 1 μm.

(13) In the method for manufacturing the silicon carbide semiconductor device, in the step of forming the first carbon layer, silicon may be selectively removed from the surface of the silicon carbide layer by reaction of a halogen element and silicon.

Thereby, silicon can be efficiently separated from the surface of the silicon carbide layer.

(14) In the method for manufacturing the silicon carbide semiconductor device, in the step of forming the first carbon layer, silicon may be selectively removed from the surface of the silicon carbide layer by heating the silicon carbide layer in an atmosphere including a gas containing the halogen element.

This facilitates formation of the first carbon layer by removing silicon using the halogen element. In addition, examples of gases that can be adopted as the "gas containing the halogen element" include chlorine ($Cl_2$) gas, fluorine ($F_2$) gas, bromine ($Br_2$) gas, iodine ($I_2$) gas, hydrogen chloride (HCl) gas, boron trichloride ($BCl_3$) gas, sulfur hexafluoride ($SF_6$) gas, carbon tetrafluoride ($CF_4$) gas, and the like.

(15) In the method for manufacturing the silicon carbide semiconductor device, in the step of forming the first carbon layer, silicon may be selectively removed from the surface of the silicon carbide layer by holding the silicon carbide layer in a plasma containing the halogen element.

This further facilitates formation of the first carbon layer by removing silicon using the halogen element. In addition, examples of plasmas that can be adopted as the "plasma containing the halogen element" include a plasma containing one or more elements selected from the group consisting of chlorine (Cl), fluorine (F), bromine (Br), and iodine (I).

(16) The method for manufacturing the silicon carbide semiconductor device may further include the step of removing the first carbon layer and the second carbon layer, after the step of heating the silicon carbide layer.

Thereby, a gate oxide film can be formed on the surface of the silicon carbide layer after the first carbon layer and the second carbon layer are removed therefrom.

(17) In the method for manufacturing the silicon carbide semiconductor device, the surface of the silicon carbide layer may include a main surface (10A) having an off angle of less than or equal to 8° relative to a (000-1) plane.

Thereby, the speed of forming the first carbon layer by removing silicon from the surface of the silicon carbide layer is further improved. As a result, manufacturing efficiency can be further improved.

Details of Embodiment of the Invention of the Present Application

Next, a specific example of the embodiment of the present invention will be described with reference to the drawings. It should be noted that, in the below-mentioned drawings, the same or corresponding portions are given the same reference characters and are not described repeatedly. Further, in the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification.

First Embodiment

Figure 1:
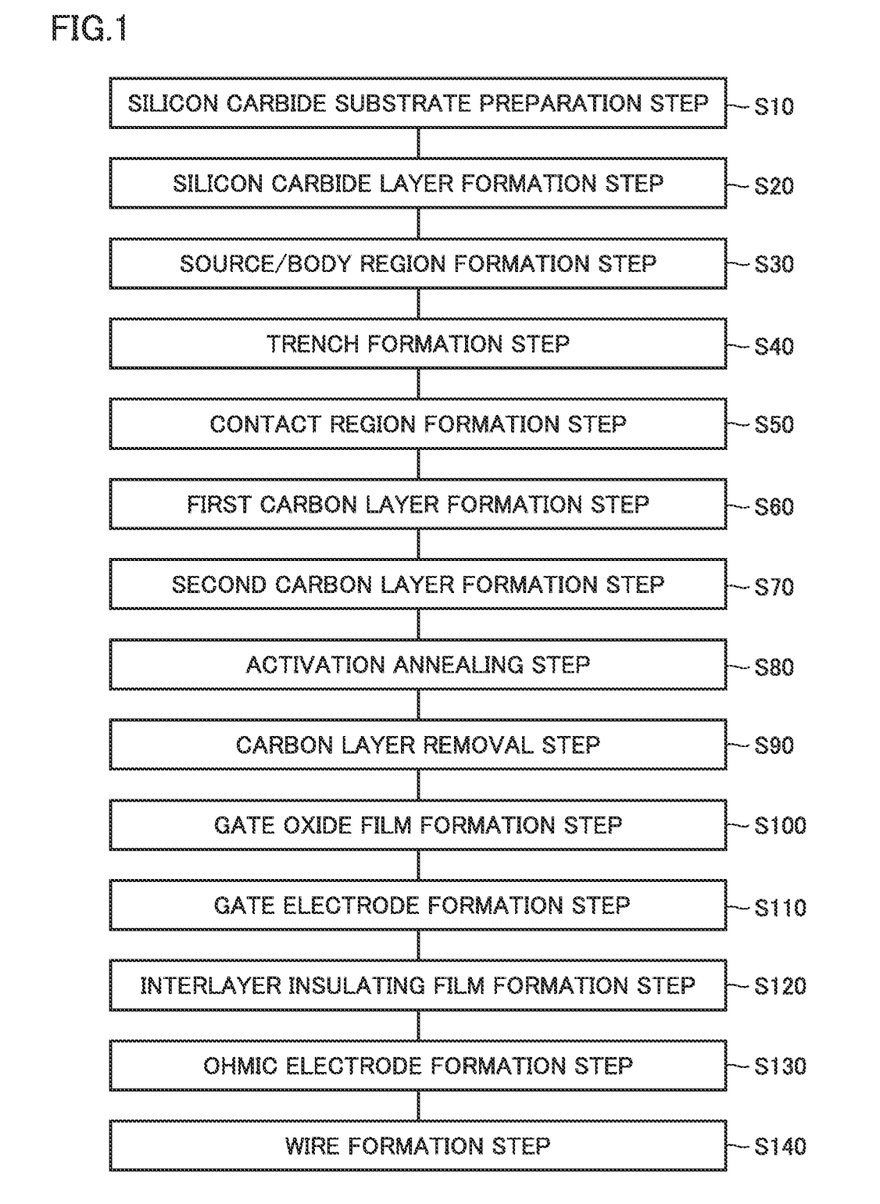
FIG. 1 is a flowchart schematically showing a method for manufacturing a silicon carbide semiconductor device in accordance with a first embodiment.

First, a method for manufacturing a silicon carbide (SiC) semiconductor device in accordance with a first embodiment as one embodiment of the present invention will be described. Referring to FIG. 1, in the method for manufacturing the SiC semiconductor device in accordance with the present embodiment, first, a silicon carbide (SiC) substrate preparation step is performed as a step (S10). In this step (S10), referring to FIG. 2, a SiC substrate 11 is prepared for example by cutting an ingot (not shown) made of 4H-SiC and performing polishing treatment or the like.

Figure 2:
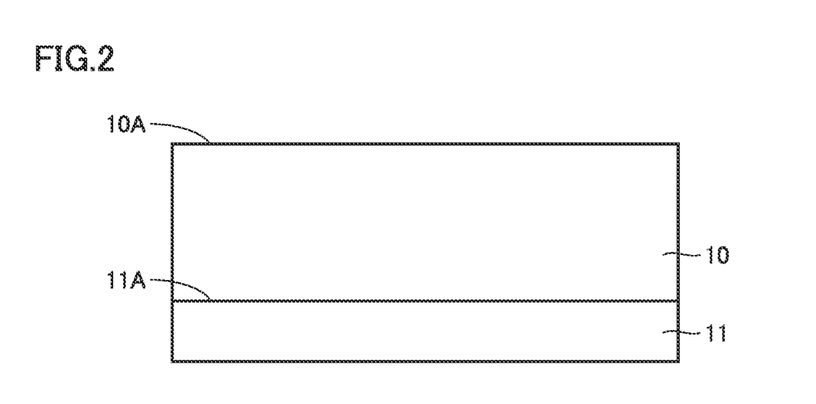
FIG. 2 is a schematic view for illustrating steps (S10) and (S20) of the method for manufacturing the silicon carbide semiconductor device in accordance with the first embodiment.

A main surface 11A of SiC substrate 11 has an off angle of less than or equal to 8°, preferably an off angle of less than or equal to 4°, relative to a (000-1) plane. Further, the maximum value of the width of SiC substrate 11 is, for example, more than or equal to 100 mm.

Next, a silicon carbide (SiC) layer formation step is performed as a step (S20). In this step (S20), referring to FIG. 2, a SiC layer 10 is formed on one main surface 11A of SiC substrate 11 by epitaxial growth. A main surface 10A of SiC layer 10 has an off angle of less than or equal to 8°, preferably an off angle of less than or equal to 4°, relative to the (000-1) plane. Further, a projection/depression of more than or equal to 0.5 μm (for example, a mesa structure or the like) is formed in main surface 10A of SiC layer 10. It should be noted that the expression "projection/depression of more than or equal to 0.5 μm" means that the maximum value of the difference in height in entire main surface 10A is more than or equal to 0.5 μm.

Figure 3:
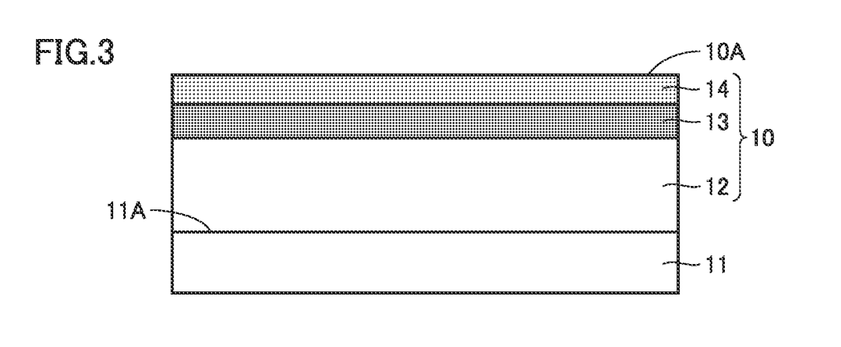
FIG. 3 is a schematic view for illustrating a step (S30) of the method for manufacturing the silicon carbide semiconductor device in accordance with the first embodiment.

Next, a source/body region formation step is performed as a step (S30). In this step (S30), referring to FIG. 3, first, a body region 13 having p type conductivity type is formed within SiC layer 10 by implanting, for example, aluminum (Al) ions into SiC layer 10 from the main surface 10A side. Next, a source region 14 having n type conductivity type is formed within SiC layer 10 by implanting, for example, phosphorus (P) ions into SiC layer 10 to a depth shallower than that of the Al ions. A region of SiC layer 10 in which neither body region 13 nor source region 14 is formed serves as a drift region 12.

Figure 4:
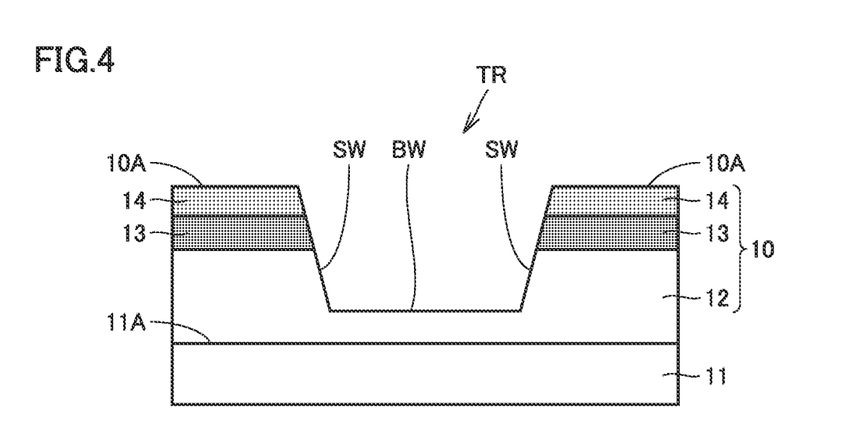
FIG. 4 is a schematic view for illustrating a step (S40) of the method for manufacturing the silicon carbide semiconductor device in accordance with the first embodiment.

Next, a trench formation step is performed as a step (S40). In this step (S40), first, a mask (not shown) made of silicon dioxide ($SiO_2$) having an opening is formed on main surface 10A of SiC layer 10. Then, a trench TR is formed by a method including dry etching such as RIE (Reactive Ion Etching) using the mask, thermal etching using a halogen-based gas such as chlorine ($Cl_2$), or a combination thereof. Trench TR has a sidewall surface SW and a bottom surface BW, and is formed to penetrate source region 14 and body region 13 and reach drift region 12. That is, trench TR is formed such that side wall surface SW exposes drift region 12, body region 13, and source region 14, and bottom surface BW is located within drift region 12. Trench TR is formed to extend in a direction along main surface 10A of SiC layer 10 (in FIG. 4, in a depth direction of the paper plane). Further, trench TR is formed to have sidewall surface SW made of, for example, a (03-38) plane.

Figure 5:
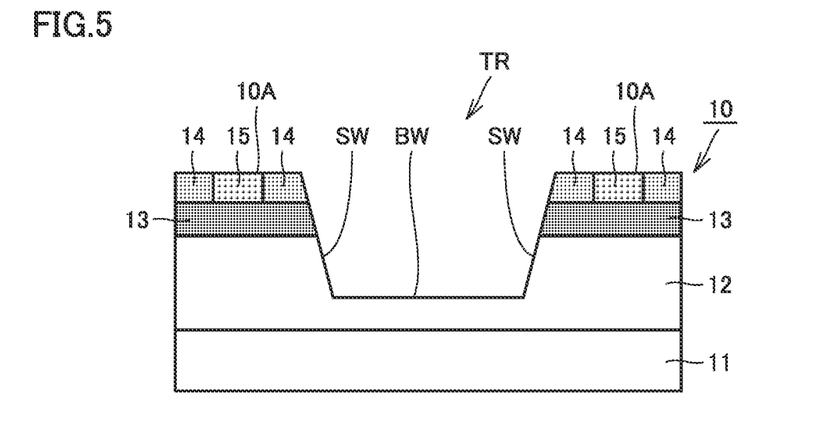
FIG. 5 is a schematic view for illustrating a step (S50) of the method for manufacturing the silicon carbide semiconductor device in accordance with the first embodiment.

Next, a contact region formation step is performed as a step (S50). In this step (S50), referring to FIG. 5, a contact region 15 is formed within source region 14 by implanting, for example, Al ions into source region 14. This ion implantation can be performed, for example, after forming a mask (not shown) having an opening at a desired region into which ions are to be implanted, on main surface 10A of SiC layer 10. Thus, an impurity region (body region 13, source region 14, and contact region 15) is formed in SiC layer 10.

Next, a first carbon layer formation step is performed as a step (S60). In this step (S60), referring to FIG. 6, silicon is selectively removed from a surface (main surface 10A, sidewall surface SW, and bottom surface BW) of SiC layer 10 having the impurity region (body region 13, source region 14, and contact region 15) formed therein, and thereby a first carbon layer 20 is formed on the surface.

Figure 6:
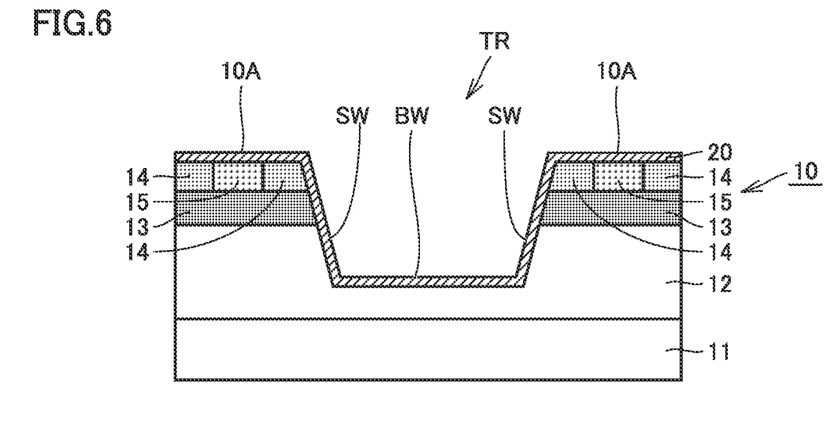
FIG. 6 is a schematic view for illustrating a step (S60) of the method for manufacturing the silicon carbide semiconductor device in accordance with the first embodiment.

In this step (S60), silicon is selectively removed by reaction of a halogen element and silicon constituting SiC layer 10. More specifically, silicon may be selectively removed from the surface of SiC layer 10 by heating SiC layer 10 in an atmosphere including a gas containing the halogen element, or by holding SiC layer 10 in a plasma containing the halogen element. Thereby, silicon is selectively removed from main surface 10A of SiC layer 10 and sidewall surface SW and bottom surface BW of trench TR, and the surface is transformed into first carbon layer 20.

In this step (S60), first carbon layer 20 is formed to have a thickness of more than or equal to 10 nm and less than or equal to 50 nm. The thickness of first carbon layer 20 is preferably more than or equal to 10 nm and less than or equal to 100 nm, and more preferably more than or equal to 20 nm and less than or equal to 50 nm.

Figure 7:
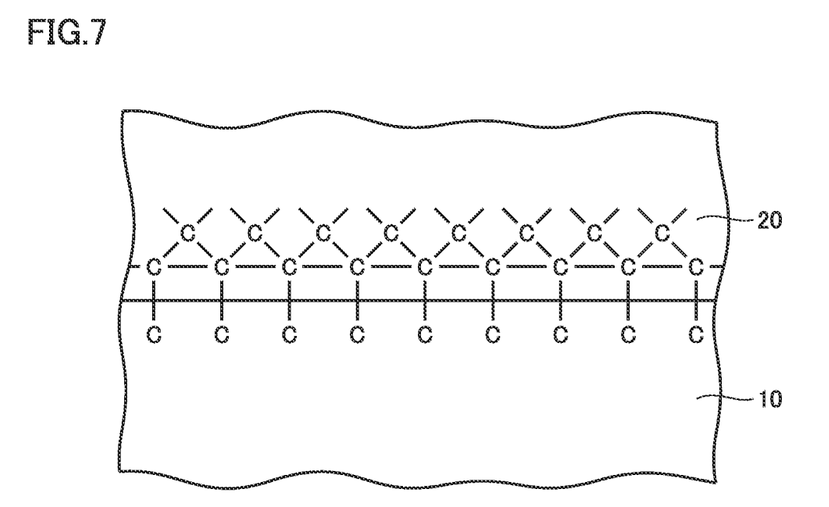
FIG. 7 is a schematic view schematically showing a bonding state of carbon atoms at an interface between a silicon carbide layer and a first carbon layer.

FIG. 7 schematically shows a bonding state of carbon atoms at an interface between first carbon layer 20 and SiC layer 10. In FIG. 7, each carbon atom is indicated by "C", and bonding between carbon atoms is indicated by a straight line connecting "C". First carbon layer 20 is formed by transforming the surface of SiC layer 10, as described above. Thus, carbon atoms constituting first carbon layer 20 and carbons atom constituting SiC layer 10 are in a state where they are atomically bonded across the entire interface. Thereby, the surface of SiC layer 10 is in a state where it is reliably protected by first carbon layer 20. First carbon layer 20 has, for example, a graphene structure, a diamond structure, a DLC structure, or the like.

Next, a second carbon layer formation step is performed as a step (S70). In this step (S70), referring to FIG. 8, a resist material is applied on first carbon layer 20 by, for example, a spin coating method or the like, to form a resist film (not shown) on first carbon layer 20. Next, the resist film is heated at a temperature of more than or equal to 800° C. and less than or equal to 1000° C. (for example, 900° C.), to carbonize the resist film. Thereby, a second carbon layer 21 made of a single layer is formed on first carbon layer 20.

Figure 8:
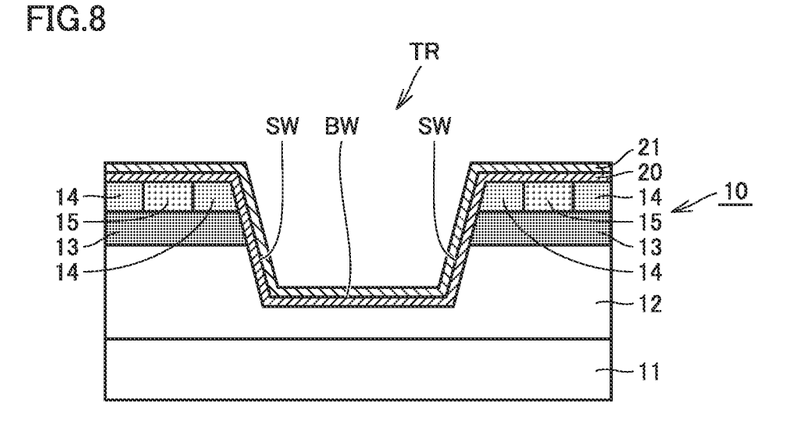
FIG. 8 is a schematic view for illustrating a step (S70) of the method for manufacturing the silicon carbide semiconductor device in accordance with the first embodiment.

In this step (S70), second carbon layer 21 is formed to have a thickness of more than or equal to 50 nm and less than or equal to 2000 nm. The thickness of second carbon layer 21 is preferably more than or equal to 100 nm and less than or equal to 1500 nm, and more preferably more than or equal to 200 nm and less than or equal to 1000 nm.

In the steps (S60) and (S70), first and second carbon layers 20, 21 are formed such that the total thickness of first carbon layer 20 and second carbon layer 21 is more than or equal to 60 nm and less than or equal to 2 μm. The total thickness of first carbon layer 20 and second carbon layer 21 is preferably more than or equal to 100 nm and less than or equal to 1500 nm, and preferably more than or equal to 200 nm and less than or equal to 1000 nm. Further, first carbon layer 20 is formed to have a density higher than that of second carbon layer 21.

Although second carbon layer 21 may be formed in this step (S70) by a method of carbonizing a resist film as described above, the present invention is not limited thereto. Second carbon layer 21 may be formed by a method such as a sputtering method or a CVD method using a gas of a hydrocarbon such as ethylene ($C_2H_6$) or propane ($C_3H_8$), for example.

Next, an activation annealing step is performed as a step (S80). In this step (S80), referring to FIG. 8, SiC layer 10 having first carbon layer 20 and second carbon layer 21 formed therein is heated at a predetermined temperature. Thereby, the impurities introduced in the steps (S30) and (S50) described above are activated, and desired carriers are generated in the impurity region.

In this step (S80), SiC layer 10 may be heated by being held at a temperature of more than or equal to 1600° C. and less than or equal to 1900° C., for a time of more than or equal to two minutes and less than or equal to five minutes. The temperature for heating SiC layer 10 is preferably more than or equal to 1800° C. and less than or equal to 1900° C.

Figure 9:
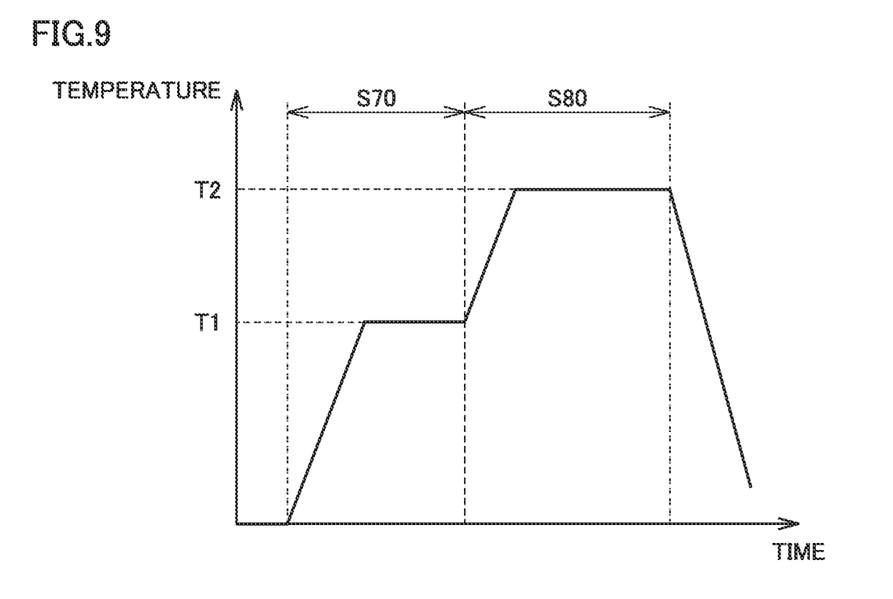
FIG. 9 is a graph showing a heating pattern in steps (S70) and (S80) of the method for manufacturing the silicon carbide semiconductor device in accordance with the first embodiment.

FIG. 9 is a graph showing a pattern of heating the SiC layer in the steps (S70) and (S80), in which the axis of abscissas represents time and the axis of ordinates represents temperature. Referring to FIG. 9, in this step (S80), the SiC layer may be heated successively after forming the second carbon layer by carbonizing the resist film in the step (S70). More specifically, after the temperature is increased to a temperature for heating the resist film (temperature $T_1$) and the SiC layer is held at temperature $T_1$ to complete carbonization of the resist film in the step (S70), activation annealing treatment may be performed with the temperature being increased to a temperature $T_2$, without decreasing the temperature to room temperature. It should be noted that the pattern of heating the SiC layer is not limited to the above case, and a heating pattern in which the temperature is once cooled down to room temperature after the step (S70) is completed and then the step (S80) is performed may be used.

Next, a carbon layer removal step is performed as a step (S90). In this step (S90), first and second carbon layers 20, 21 formed in the steps (S60) and (S70) described above are oxidized and thereby removed. More specifically, first and second carbon layers 20, 21 are removed, for example, by heating first and second carbon layers 20, 21 in an atmosphere containing oxygen ($O_2$). This removal of the carbon layers by oxidation can be performed concurrently or successively with sacrificial oxidation treatment on SiC layer 10 or a gate oxide film formation step (S100) described below.

Figure 10:
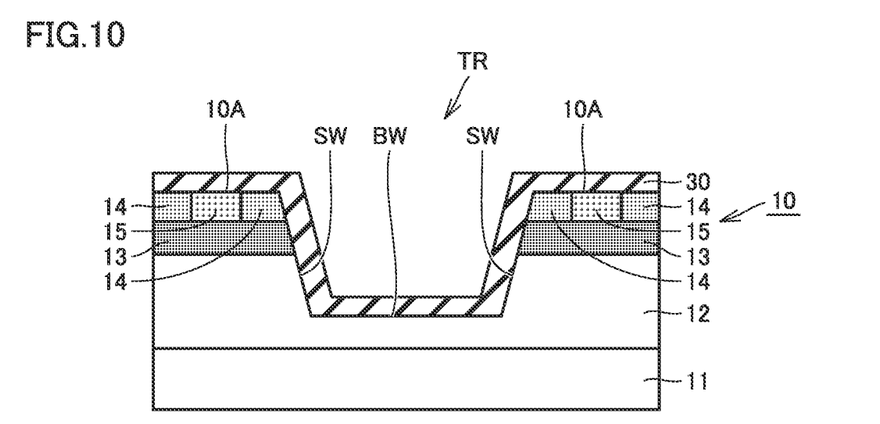
FIG. 10 is a schematic view for illustrating a step (S100) of the method for manufacturing the silicon carbide semiconductor device in accordance with the first embodiment.

Next, a gate oxide film formation step is performed as a step (S100). In this step (S100), referring to FIG. 10, SiC layer 10 is heated, for example, in an atmosphere containing oxygen ($O_2$). Thereby, a gate oxide film 30 is formed to extend along main surface 10A of SiC layer 10 and sidewall surface SW and bottom surface BW of trench TR.

Figure 11:
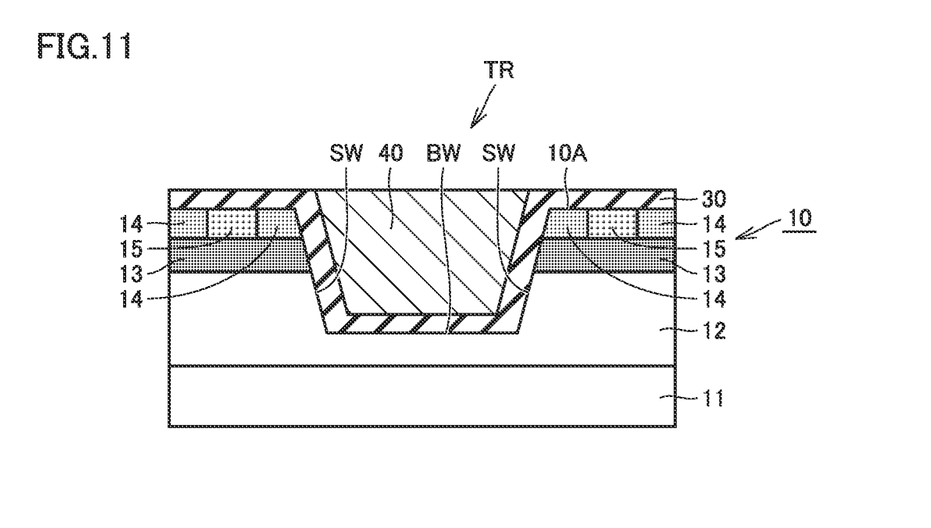
FIG. 11 is a schematic view for illustrating a step (S110) of the method for manufacturing the silicon carbide semiconductor device in accordance with the first embodiment.

Next, a gate electrode formation step is performed as a step (S110). In this step (S110), referring to FIG. 11, a gate electrode 40 made of polysilicon is formed, for example, by a LP (Low Pressure)-CVD method, to fill trench TR.

Figure 12:
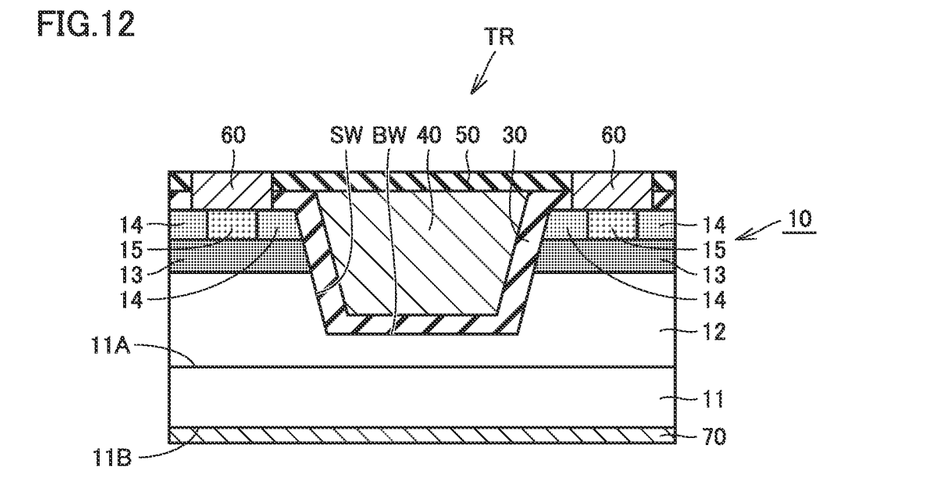
FIG. 12 is a schematic view for illustrating steps (S120) and (S130) of the method for manufacturing the silicon carbide semiconductor device in accordance with the first embodiment.

Next, an interlayer insulating film formation step is performed as a step (S120). In this step (S120), referring to FIG. 12, an interlayer insulating film 50 made of $SiO_2$ is formed, for example, by a P (Plasma)-CVD method, to surround gate electrode 40 together with gate oxide film 30.

Next, an ohmic electrode formation step is performed as a step (S130). In this step (S130), referring to FIG. 12, first, interlayer insulating film 50 and gate oxide film 30 are removed at a region in which a source electrode 60 is to be formed. Then, a film made of nickel (Ni), for example, is formed at that region. On the other hand, a film made of Ni is formed on a main surface 11B of SiC substrate 11 opposite to main surface 11A. Thereafter, alloying heat treatment is performed to silicidate at least a portion of the films made of Ni, and thereby source electrode 60 and a drain electrode 70 are formed.

Figure 13:
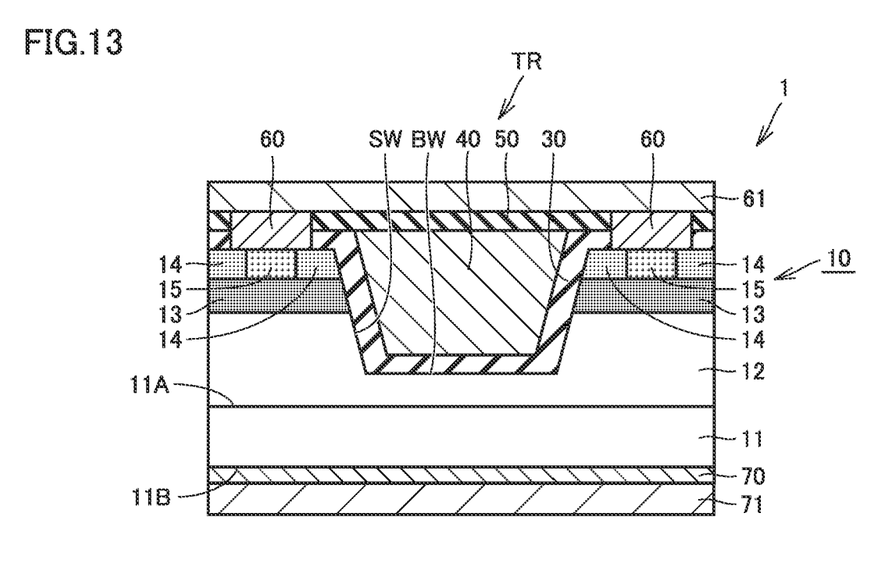
FIG. 13 is a schematic view for illustrating a step (S140) of the method for manufacturing the silicon carbide semiconductor device in accordance with the first embodiment.

Next, a wire formation step is performed as a step (S140). In this step (S140), referring to FIG. 13, a source wire 61 made of a conductor such as Al or gold (Au) is formed, for example, by an evaporation method, to cover interlayer insulating film 50 and source electrode 60. Further, a back surface protection electrode 71 made of a conductor such as Al or Au is formed on drain electrode 70. By performing the above steps (S10) to (S140), a MOSFET 1 (SiC semiconductor device) is manufactured, and the method for manufacturing the SiC semiconductor device in accordance with the present embodiment is completed.

As described above, in the method for manufacturing the SiC semiconductor device in accordance with the present embodiment, first, first carbon layer 20 is formed on the surface (main surface 10A, sidewall surface SW, bottom surface BW) of SiC layer 10 by selectively removing silicon from the surface. Thereby, the surface of SiC layer 10 can be reliably protected by first carbon layer 20. Next, second carbon layer 21 is formed on first carbon layer 20, and thereafter SiC layer 10 is heated (activation annealing). Thereby, the thickness of the carbon layers required as the total thickness of first carbon layer 20 and second carbon layer 21 can be ensured even when the thickness of first carbon layer 20 is reduced to suppress consumption of the impurity region by the carbon layer. Accordingly, this can suppress a reduction in manufacturing efficiency due to formation of thick first carbon layer 20 and the resulting increased consumption of the impurity region. Therefore, according to the method for manufacturing the SiC semiconductor device in accordance with the present embodiment, a reduction in manufacturing efficiency can be suppressed, and activation annealing can be performed with the surface of SiC layer 10 being protected more reliably.

Figure 14:
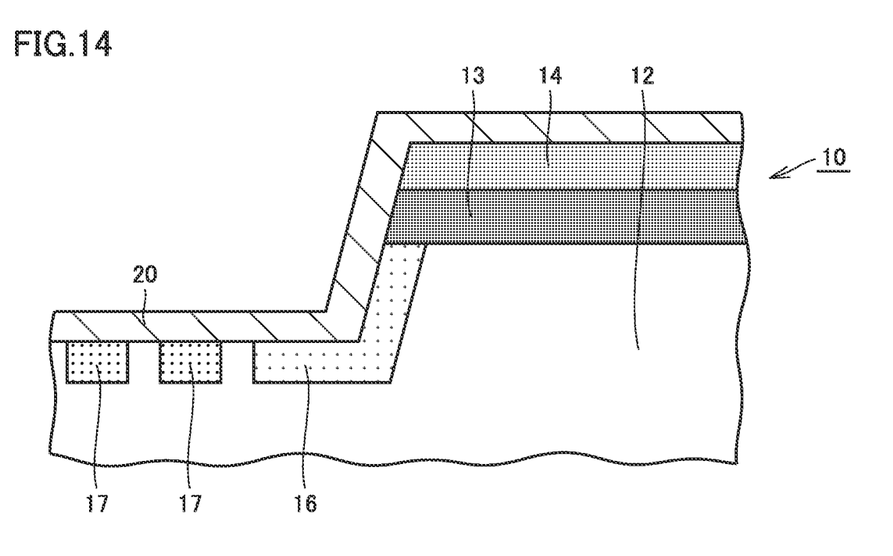
FIG. 14 is a schematic view showing a structure of a termination region of the silicon carbide layer in accordance with the first embodiment.
Figure 15:
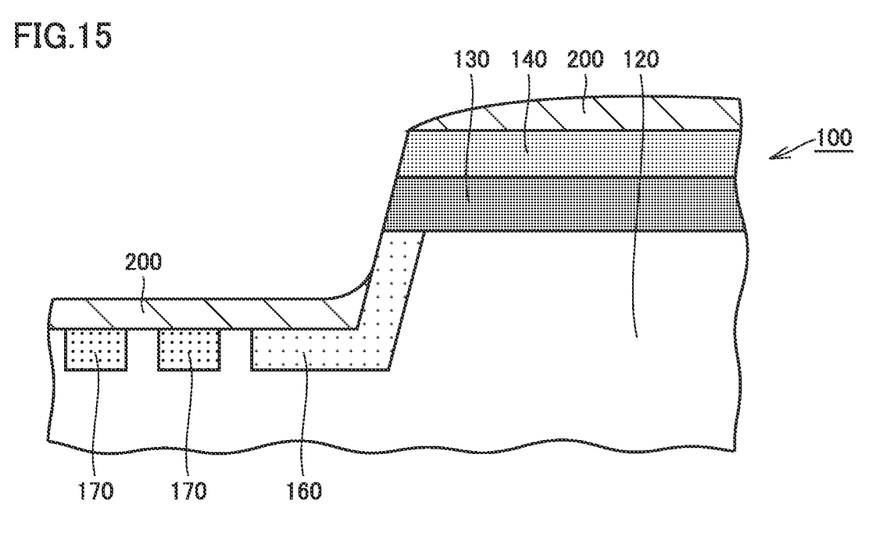
FIG. 15 is a schematic view showing a structure of a termination region of a silicon carbide layer in accordance with a comparative example.

FIG. 14 is a view showing a structure of a region to serve as a termination region of the SiC semiconductor device in the present embodiment, and FIG. 15 is a view showing a structure of a region to serve as a termination region of a SiC semiconductor device in a comparative example. Referring to FIGS. 14 and 15, drift region 12, 120, body region 13, 130, and source region 14, 140, as well as a JTE (Junction Termination Extension) region 16, 160 and a guard ring region 17, 170 as electric field relaxing regions, are formed in SiC layer 10, 100. Further, in the present embodiment, first carbon layer 20 is formed on the surface of SiC layer 10 by selectively removing silicon from the surface (FIG. 14), whereas in the comparative example, a first carbon layer 200 is formed by forming a resist film on the surface of SiC layer 100 by the spin coating method and carbonizing the resist film (FIG. 15). As shown in FIGS. 14 and 15, in the comparative example, since the resist film has a relatively thin thickness at a stepped portion, it is difficult to fully cover the surface of SiC layer 100 at the stepped portion with first carbon layer 200. In contrast, in the present embodiment, the surface of SiC layer 10 can be fully covered with first carbon layer 20, even at a stepped portion. Thus, in the present embodiment, even when a step difference or projection/depression exists in the surface of SiC layer 10, the surface can be reliably covered with the carbon layer.

In the method for manufacturing the silicon carbide semiconductor device, in the SiC substrate preparation step (S10), SiC substrate 11 whose width has a maximum value of more than or equal to 100 mm may be prepared. Further, a projection/depression of more than or equal to 0.5 µm may be formed in the surface (main surface 10A, sidewall surface SW, bottom surface BW) of SiC layer 10 formed on SiC substrate 11.

In a case where the substrate has a large size as described above, when the first carbon layer is formed by applying a resist film by the spin coating method and carbonizing the resist film, film thickness has large variations (i.e., the film has a small thickness at a central portion and has a large thickness at an outer peripheral portion). Further, in a case where the surface of SiC layer 10 has a large projection/depression, it is difficult to fully cover the entire surface with the resist film formed by the spin coating method. In contrast, in the present embodiment, first carbon layer 20 is formed by selectively removing silicon from the surface of SiC layer 10, and second carbon layer 21 obtained by carbonizing the resist film is formed on first carbon layer 20. Accordingly, the surface of SiC layer 10 can be protected reliably even when the substrate has a large size and the surface has a large projection/depression.

Second Embodiment

Next, a second embodiment as another embodiment of the present invention will be described. Basically, a method for manufacturing a SiC semiconductor device in accordance with the present embodiment is performed in the same way as that of the first embodiment, and exhibits the same effect as that of the first embodiment. However, the method for manufacturing the SiC semiconductor device in accordance with the present embodiment is different from that of the first embodiment in the second carbon layer formation step.

Figure 16:
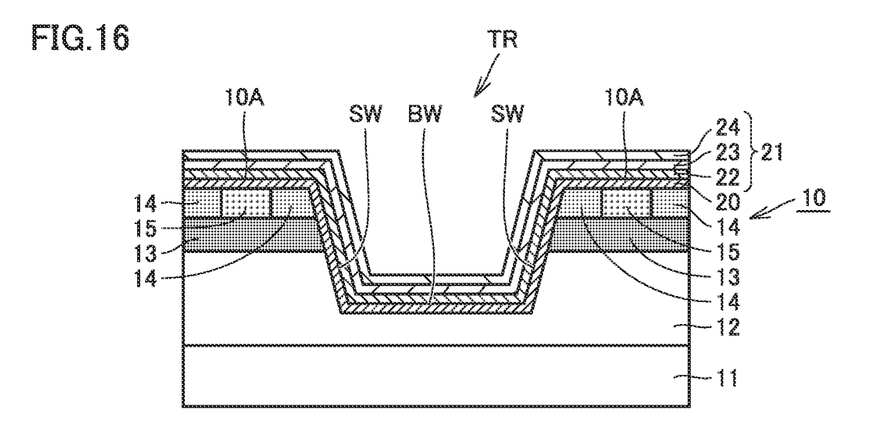
FIG. 16 is a schematic view for illustrating a method for manufacturing a silicon carbide semiconductor device in accordance with a second embodiment.

Referring to FIG. 16, in the present embodiment, second carbon layer 21 constituted of a plurality of laminated carbon layers 22, 23, and 24 is formed on first carbon layer 20. More specifically, first laminated carbon layer 22 is formed by the CVD method using a hydrocarbon gas such as ethylene gas or propane gas, second laminated carbon layer 23 is formed by the sputtering method, and third laminated carbon layer 24 is formed by the method of carbonizing a resist film. Accordingly, laminated carbon layers 22 to 24 are formed such that the laminated carbon layer close to the surface (main surface 10A, sidewall surface SW, bottom surface BW) of SiC layer 10 in a direction perpendicular to the surface has a relatively high density. By constituting second carbon layer 21 of a plurality of layers as described above, a dense film can be provided when compared with a case where second carbon layer 21 is constituted of a single layer as in the first embodiment. As a result, the surface of SiC layer 10 can be protected further reliably.

Further, although the present embodiment has described the case where second carbon layer 21 is constituted of three layers, the present invention is not limited thereto. The number of layers in second carbon layer 21 is not particularly limited as long as second carbon layer 21 is constituted of a plurality of layers (two or more layers). Furthermore, the method for forming each laminated carbon layer can also be arbitrarily selected from the methods described above (the method of carbonizing a resist film, the CVD method, and the sputtering method).

It should be understood that the embodiment disclosed herein is illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The method for manufacturing the silicon carbide semiconductor device in the present invention is particularly advantageously applicable to a method for manufacturing a silicon carbide semiconductor device which is required to suppress a reduction in manufacturing efficiency and perform activation annealing with a surface of a silicon carbide layer being protected more reliably.

REFERENCE SIGNS LIST

1: MOSFET; 10, 100: silicon carbide (SiC) layer; 10A, 11A, 11B: main surface; 11: silicon carbide (SiC) substrate; 12, 120: drift region; 13, 130: body region; 14, 140: source region; 15: contact region; 16, 160: JTE region; 17, 170: guard ring region; 20: first carbon layer; 21: second carbon layer; 22: first laminated carbon layer; 23: second laminated carbon layer; 24: third laminated carbon layer; 30: gate oxide film; 40: gate electrode; 50: interlayer insulating film; 60: source electrode; 61: source wire; 70: drain electrode; 71: back surface protection electrode; BW: bottom surface; SW: sidewall surface; TR: trench.

The invention claimed is:

1. A method for manufacturing a silicon carbide semiconductor device, comprising the steps of:
   forming an impurity region in a silicon carbide layer;
   forming a first carbon layer on a surface of the silicon carbide layer having the impurity region formed therein by selectively removing silicon from the surface;
   forming a second carbon layer on the first carbon layer; and
   heating the silicon carbide layer having the first carbon layer and the second carbon layer formed on the silicon carbide layer,
   wherein, in the step of forming the second carbon layer, the second carbon layer constituted of a plurality of layers is formed,
   wherein a plurality of laminated carbon layers constituting the plurality of layers are formed such that the laminated carbon layer close to the surface of the silicon carbide layer has a relatively high density, and
   wherein, in the step of forming the first carbon layer, silicon is selectively removed from the surface of the silicon carbide layer by reaction of a halogen element and silicon.

2. The method for manufacturing the silicon carbide semiconductor device according to claim 1, wherein, in the step of forming the first carbon layer, the first carbon layer is formed to have a density higher than that of the second carbon layer.

3. The method for manufacturing the silicon carbide semiconductor device according to claim 1, wherein the second carbon layer is formed by at least one method selected from the group consisting of a method of carbonizing a resist film, a CVD method, and a sputtering method.

4. The method for manufacturing the silicon carbide semiconductor device according to claim 1, wherein, in the step of heating the silicon carbide layer, the silicon carbide layer is heated at a temperature of more than or equal to 1600° C. and less than or equal to 1900° C.

5. The method for manufacturing the silicon carbide semiconductor device according to claim 1, wherein, in the step of forming the first carbon layer, the first carbon layer having a thickness of more than or equal to 10 nm and less than or equal to 50 nm is formed.

6. The method for manufacturing the silicon carbide semiconductor device according to claim 1, wherein, in the step of forming the second carbon layer, the second carbon layer having a thickness of more than or equal to 50 nm is formed.

7. The method for manufacturing the silicon carbide semiconductor device according to claim 1, wherein, in the steps of forming the first carbon layer and forming the second carbon layer, the first carbon layer and the second carbon layer are formed such that a total thickness of the first carbon layer and the second carbon layer is less than or equal to 1 μm.

8. The method for manufacturing the silicon carbide semiconductor device according to claim 1, wherein, in the step of forming the first carbon layer, silicon is selectively removed from the surface of the silicon carbide layer by heating the silicon carbide layer in an atmosphere including a gas containing the halogen element.

9. The method for manufacturing the silicon carbide semiconductor device according to claim 1, wherein, in the step of forming the first carbon layer, silicon is selectively removed from the surface of the silicon carbide layer by holding the silicon carbide layer in a plasma containing the halogen element.

10. The method for manufacturing the silicon carbide semiconductor device according to claim 1, further comprising the step of removing the first carbon layer and the second carbon layer, after the step of heating the silicon carbide layer.

11. The method for manufacturing the silicon carbide semiconductor device according to claim 1, wherein the surface of the silicon carbide layer includes a main surface having an off angle of less than or equal to 8° relative to a (000-1) plane.

12. A method for manufacturing the silicon carbide semiconductor device, comprising the steps of:
    forming an impurity region in a silicon carbide layer;
    forming a first carbon layer on a surface of the silicon carbide layer having the impurity region formed therein by selectively removing silicon from the surface;
    forming a second carbon layer on the first carbon layer; and
    heating the silicon carbide layer having the first carbon layer and the second carbon layer formed on the silicone carbide layer,
    wherein, in the step of forming the second carbon layer, the second carbon layer is formed by heating the resist film at a temperature of more than or equal to 800° C. and less than or equal to 1000° C. and carbonizing the resist film, and
    wherein, in the step of forming the first carbon layer, silicon is selectively removed from the surface of the silicon carbide layer by reaction of a halogen element and silicon.

13. The method for manufacturing the silicon carbide semiconductor device according to claim 12, wherein, in the step of heating the silicon carbide layer, the silicon carbide layer is heated successively after carbonization of the resist film is completed in the step of forming the second carbon layer.

* * * * *